United States Patent
Kim et al.

(10) Patent No.: US 10,242,957 B2
(45) Date of Patent: Mar. 26, 2019

(54) COMPARTMENT SHIELDING IN FLIP-CHIP (FC) MODULE

(71) Applicant: QUALCOMM Incorporated, San Diego, CA (US)

(72) Inventors: Daeik Daniel Kim, San Diego, CA (US); Changhan Hobie Yun, San Diego, CA (US); Mario Francisco Velez, San Diego, CA (US); David Francis Berdy, San Diego, CA (US); Chengjie Zuo, Santee, CA (US); Jonghae Kim, San Diego, CA (US); Matthew Michael Nowak, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/633,934

(22) Filed: Feb. 27, 2015

(65) Prior Publication Data
US 2016/0254236 A1 Sep. 1, 2016

(51) Int. Cl.
*H01L 23/60* (2006.01)
*H01L 23/31* (2006.01)
(Continued)

(52) U.S. Cl.
CPC .......... *H01L 23/60* (2013.01); *H01L 23/3114* (2013.01); *H01L 23/552* (2013.01);
(Continued)

(58) Field of Classification Search
None
See application file for complete search history.

(56) References Cited

U.S. PATENT DOCUMENTS 6,492,194 B1 * 12/2002 Bureau .............. H01L 21/56
257/E21.502
6,649,446 B1 * 11/2003 Goetz .............. H01L 21/563
257/E21.503
(Continued)

FOREIGN PATENT DOCUMENTS

JP H110173005 A 6/1998

OTHER PUBLICATIONS

Fillion, Ray, "Advanced Packaging Technology for Leading Edge Microelectronics and Flexible Electronics", GE Global Research, Cornell University MSE 542, Jan. 18, 2015 downloaded from URL <https://web.archive.org/web/20150115000000*/http://people.ccmr.cornell.edu/~cober/mse542/page2/files/Fillion%20GE.pdf> on Feb. 3, 2016.*
(Continued)

Primary Examiner — Joseph Schoenholtz
(74) Attorney, Agent, or Firm — Muncy, Geissler, Olds & Lowe, P.C.

(57) ABSTRACT

Ground shielding is achieved by a conductor shield having conductive surfaces that immediately surround individual chips within a multichip module or device, such as a multichip module or device with flip-chip (FC) bumps. Intra-module shielding between individual chips within the multichip module or device is achieved by electromagnetic or radio-signal (RF) isolation provided by the surfaces of the conductor shield immediately surrounding each of the chips. The conductor shield is directly connected to one or more grounded conductor portions of a substrate or interposer to ensure reliable grounding.

30 Claims, 4 Drawing Sheets

(51) Int. Cl.
  *H01L 23/00* (2006.01)
  *H01L 25/065* (2006.01)
  *H01L 25/00* (2006.01)
  *H01L 23/552* (2006.01)

(52) U.S. Cl.
  CPC .............. *H01L 24/00* (2013.01); *H01L 24/17* (2013.01); *H01L 25/0655* (2013.01); *H01L 25/50* (2013.01); H01L 2224/16235 (2013.01); H01L 2224/32225 (2013.01); H01L 2224/73204 (2013.01); H01L 2224/92125 (2013.01)

(56) References Cited

U.S. PATENT DOCUMENTS

| | | | | |
|---|---|---|---|---|
| 6,670,206 B2* | 12/2003 | Kim | ...................... | H01L 21/561 257/E21.503 |
| 6,992,400 B2* | 1/2006 | Tikka | .................. | H01L 23/3135 257/787 |
| 7,161,252 B2* | 1/2007 | Tsuneoka | ............ | H01L 23/3121 257/100 |
| 7,445,968 B2* | 11/2008 | Harrison | ............. | H01L 23/3677 257/660 |
| 7,687,895 B2 | 3/2010 | Brunnbauer et al. | | |
| 7,745,910 B1* | 6/2010 | Olson | .................... | H01L 21/561 257/659 |
| 7,981,730 B2 | 7/2011 | Tang et al. | | |
| 8,093,691 B1 | 1/2012 | Fuentes et al. | | |
| 9,070,793 B2* | 6/2015 | Liao | ..................... | H01L 23/3121 |
| 9,293,423 B2* | 3/2016 | Brunnbauer | .......... | H01L 21/561 |
| 2007/0138614 A1* | 6/2007 | Harrison | ............. | H01L 23/3677 257/686 |
| 2008/0203564 A1* | 8/2008 | Motoyoshi | ............ | H01L 21/563 257/737 |
| 2009/0000114 A1* | 1/2009 | Rao | ....................... | H01L 23/552 29/832 |
| 2009/0035895 A1* | 2/2009 | Lee | ..................... | H01L 23/3121 438/127 |
| 2009/0079041 A1* | 3/2009 | Huang | .................. | H01L 21/561 257/660 |
| 2010/0032815 A1* | 2/2010 | An | ....................... | H01L 23/3121 257/660 |
| 2010/0207257 A1* | 8/2010 | Lee | ....................... | B81B 7/0061 257/660 |
| 2010/0207258 A1* | 8/2010 | Eun | ....................... | H01L 23/055 257/660 |
| 2011/0006408 A1* | 1/2011 | Liao | ..................... | H01L 21/561 257/660 |
| 2011/0049703 A1* | 3/2011 | Hsu | ................... | H01L 23/49811 257/737 |
| 2011/0115060 A1* | 5/2011 | Chiu | ..................... | H01L 21/568 257/660 |
| 2011/0115066 A1* | 5/2011 | Kim | ..................... | H01L 21/561 257/690 |
| 2011/0298111 A1* | 12/2011 | Kim | ..................... | H01L 21/561 257/660 |
| 2012/0025356 A1* | 2/2012 | Liao | .................... | H01L 23/3121 257/659 |
| 2013/0277828 A1* | 10/2013 | Huang | .................... | H01L 24/16 257/737 |
| 2015/0069603 A1* | 3/2015 | Foong | .............. | H01L 23/49811 257/738 |
| 2015/0228506 A1* | 8/2015 | Tan | ...................... | H01L 21/568 438/118 |
| 2015/0287697 A1* | 10/2015 | Tsai | ....................... | H01L 23/60 257/770 |
| 2016/0270213 A1* | 9/2016 | Salehi | ................. | H05K 1/0224 |

OTHER PUBLICATIONS

Fillion, Ray, "Advanced Packaging Technology for Leading Edge Microelectronics and Flexible Electronics", MSE 542 Cornell University, downloaded from URL <http://people.ccmr.cornell.edu/~cober/mse542/page2/files/Fillion%GE.pdf> on Feb. 3, 2016.*
Wayback time machine for "http://people.ccmr.cornell.edu/~cober/mse542/page2/files/Fillion%20GE.pdf".*
Fillion, Ray, "Advanced Packaging Technology for Leading Edge Microelectronics and Flexible Electronics", MSE 542 Cornell University, downloaded from URL <http://people.ccmr.cornell.edu/~cober/mse542/page2/files/Fillion%20GE.pdf> on Feb. 3, 2016.*
International Search Report and Written Oinion—PCT/US2016/016996—ISA/EPO—dated May 4, 2016.

* cited by examiner

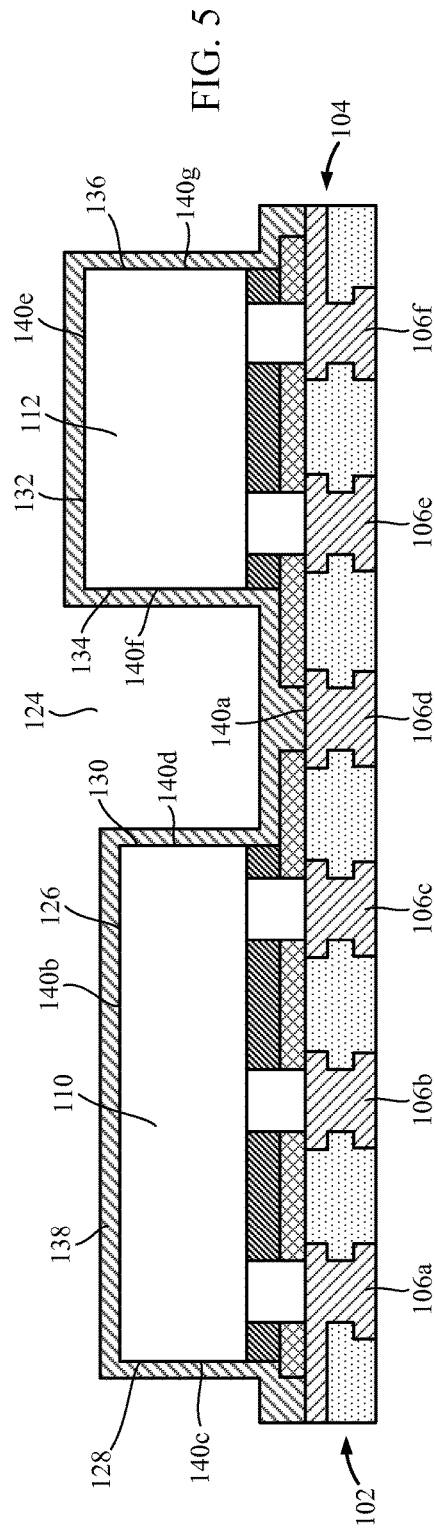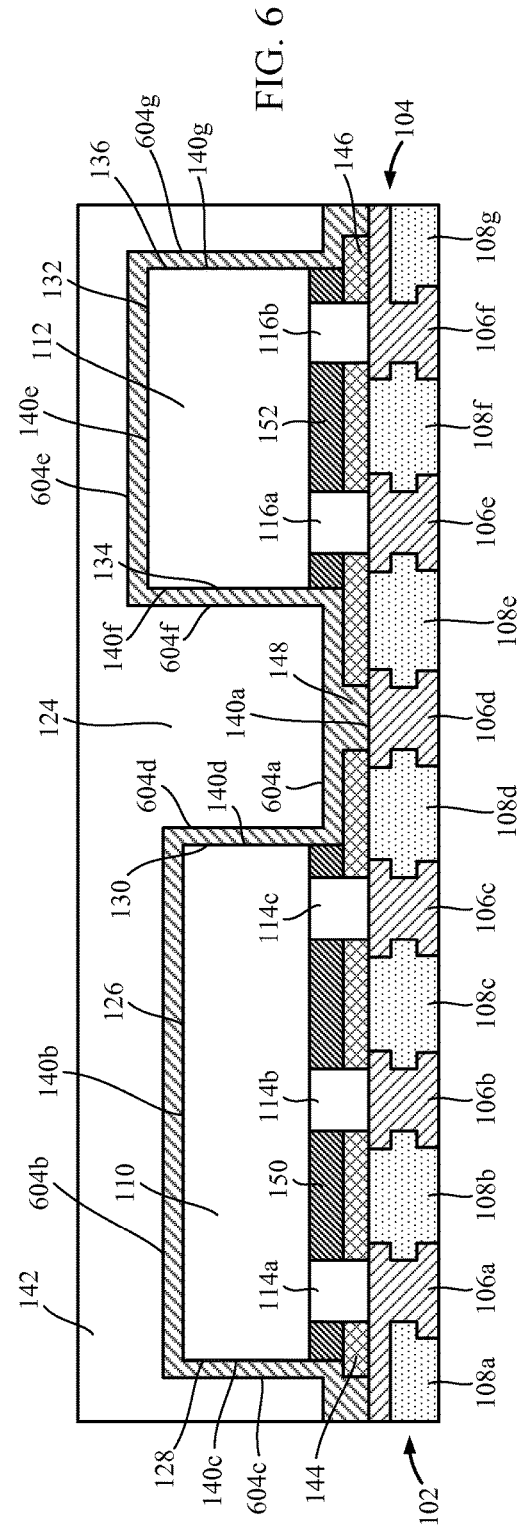

COMPARTMENT SHIELDING IN FLIP-CHIP (FC) MODULE

FIELD OF DISCLOSURE

Various embodiments described herein relate to integrated circuit packaging, and more particularly, to flip-chip packaging.

BACKGROUND

Various conventional schemes have been devised for ground shielding of chips in a multi-chip integrated circuit module with flip-chip packaging. One such conventional scheme is to provide a single metal shield that encloses a mold surrounding all of the chips within the module. While such a scheme of conventional ground shielding may be capable of providing inter-module shielding, that is, shielding between separate modules, it is not capable of providing intra-module shielding, that is, shielding between different chips within the same module. Moreover, the shielding planes in such a scheme are positioned to surround the outer surfaces of the mold that covers all of the chips within the module, and are therefore separated by considerable distances from the circuits embedded within the chips. Therefore, the grounding effect of this type of conventional flip-chip module shielding may be limited.

In order to provide intra-module shielding, another conventional scheme has been devised which includes drilling a hole through the mold between two adjacent chips in a flip-chip module, to form a gap that separates two adjacent molds each enclosing a respective chip. A metal shield is provided outside each of the molds to achieve compartmentalized shielding between adjacent chips within the module. In such a drilled compartment shielding scheme, however, the shielding planes of each of the compartmentalized metal shields are still by considerable distances from the circuits embedded within the chips due to the presence of the mold between the chip and the shielding planes. Moreover, the process of drilling holes into the mold may be expensive and difficult to control, thereby decreasing the yield and increasing the cost of manufacturing.

SUMMARY

Exemplary embodiments of the disclosure are directed to integrated circuit devices and methods of making the same.

In an embodiment, a device is provided, the device comprising: a substrate comprising at least one conductor portion and at least one insulator portion; a first plurality of bumps and a second plurality of bumps disposed on the substrate; a first chip disposed on the first plurality of bumps; a second chip disposed on the second plurality of bumps, wherein the first chip and the second chip are spaced apart by a gap, and wherein said at least one conductor portion of the substrate is positioned directly opposite the gap between the first chip and the second chip; and a conductor shield comprising a plurality of conductor surfaces, wherein at least one of the conductor surfaces is directly connected to said at least one conductor portion of the substrate directly opposite the gap between the first chip and the second chip, wherein at least one of the conductor surfaces immediately surrounds the first chip, and wherein at least one of the conductor surfaces immediately surrounds the second chip.

In another embodiment, a device is provided, the device comprising: an interposer comprising a plurality of conductor portions and a plurality of dielectric portions, the interposer having a substantially flat first surface over the conductor portions and the dielectric portions; a first plurality of flip-chip bumps and a second plurality of flip-chip bumps disposed on the first surface of the interposer; a first chip disposed on the first plurality of flip-chip bumps; a second chip disposed on the second plurality of flip-chip bumps, wherein the first chip and the second chip are spaced apart by a gap on the first surface of the interposer, and wherein at least one of the conductor portions of the interposer is positioned directly opposite the gap between the first chip and the second chip; and a conductor shield comprising a plurality of conductor surfaces, wherein at least one of the conductor surfaces is directly connected to said at least one of the conductor portions of the interposer directly opposite the gap between the first chip and the second chip, wherein at least one of the conductor surfaces immediately surrounds the first chip, and wherein at least one of the conductor surfaces immediately surrounds the second chip.

In another embodiment, a device is provided, the device comprising: a substrate comprising a plurality of conductor portions and a plurality of insulator portions, the substrate having a substantially flat first surface over the conductor portions and the insulator portions; a first plurality of bumps and a second plurality of bumps disposed on the first surface of the substrate; a first chip disposed on the first plurality of bumps; a second chip disposed on the second plurality of bumps, wherein the first chip and the second chip are spaced apart by a gap on the first surface of the substrate, and wherein at least one of the conductor portions of the substrate is positioned directly opposite the gap between the first chip and the second chip; a first capillary under-fill (CUF) disposed between the first chip and the substrate; a second CUF disposed between the second chip and the substrate; and means for ground shielding the first chip and the second chip.

In yet another embodiment, a method of making a device is provided, the method comprising: providing a substrate comprising a plurality of conductor portions and a plurality of insulator portions; providing a first solder mask and a second solder mask on the substrate, wherein the first and second solder masks are separated by an opening to expose at least one of the conductor portions of the substrate; providing a first plurality of bumps and a second plurality of bumps on the substrate; providing a first chip on the first plurality of bumps and a second chip on the second plurality of bumps, the first chip and the second chip spaced apart by a gap directly opposite said at least one of the conductor portions of the substrate exposed by the opening between the first solder mask and the second solder mask; and providing a conductor shield comprising a plurality of conductor surfaces, wherein at least one of the conductor surfaces is directly connected to said at least one of the conductor portions of the substrate exposed by the opening between the first solder mask and the second solder mask, wherein at least one of the conductor surfaces immediately surrounds the first chip, and wherein at least one of conductor surfaces immediately surrounds the second chip.

BRIEF DESCRIPTION OF THE DRAWINGS

The accompanying drawings are presented to aid in the description of embodiments of the disclosure and are provided solely for illustration of the embodiments and not limitation thereof.

FIG. 5 is a cross-sectional view illustrating a fourth step in an embodiment of a method of making the FC device of FIG. 1.

FIG. 6 is a cross-sectional view illustrating a fifth step in an embodiment of a method of making the FC device of FIG. 1.

DETAILED DESCRIPTION

Aspects of the disclosure are described in the following description and related drawings directed to specific embodiments. Alternate embodiments may be devised without departing from the scope of the disclosure. Additionally, well-known elements will not be described in detail or will be omitted so as not to obscure the relevant details of the disclosure.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation.

The terminology used herein is for the purpose of describing particular embodiments only and is not intended to be limiting of the embodiments. As used herein, the singular forms "a," "an" and "the" are intended to include the plural forms as well, unless the context clearly indicates otherwise. It will be further understood that the terms "comprises," "comprising," "includes" or "including," when used herein, specify the presence of stated features, integers, steps, operations, elements, and/or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "/" between two adjacent words has the same meaning as "or" unless expressly stated otherwise. Moreover, phrases such as "connected to," "coupled to" or "in communication with" are not limited to direct connections unless expressly stated otherwise.

Figure 1:
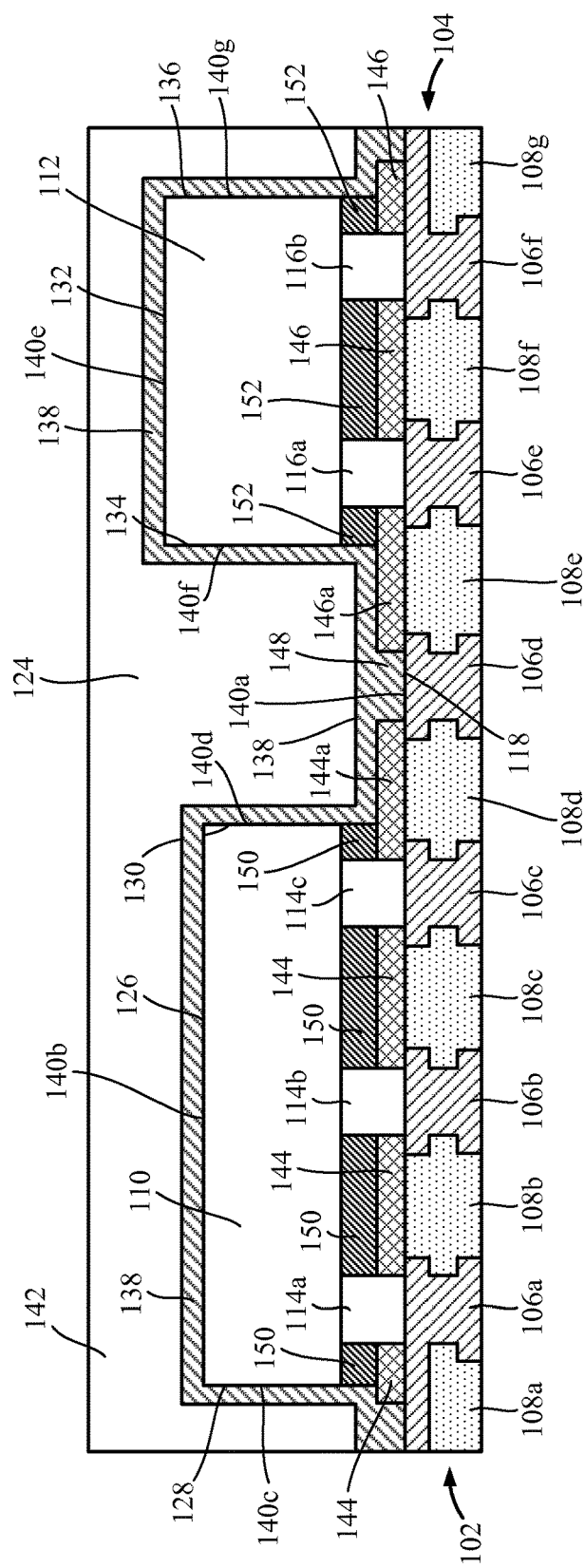
FIG. 1 is a cross-sectional view of an embodiment of a flip-chip (FC) device with ground shielding immediately surrounding the chips within the device.

FIG. 1 is a cross-sectional view of an embodiment of a flip-chip (FC) device with ground shielding immediately surrounding the chips within the device. In FIG. 1, a substrate 102 is provided for a device with multiple chips. In an embodiment, the substrate 102 comprises an interposer 104 which comprises one or more conductor portions 106a, 106b, 106c, . . . 106f and one or more insulator or dielectric portions 108a, 108b, 108c, . . . 108g. A plurality of chips may be provided on the substrate 102, and one or more integrated circuits may be embedded in each of the chips in the device. In the embodiment shown in FIG. 1, two chips 110 and 112 are shown for simplicity of illustration, although more than two chips may be provided in a device within the scope of the disclosure. In the embodiment illustrated in FIG. 1, a first plurality of bumps 114a, 114b and 114c are provided on the substrate 102 to support the first chip 110. In a similar manner, a second plurality of bumps 116a and 116b are provided on the substrate 102 to support the second chip 112. In an embodiment, the first and second pluralities of bumps 114a, 114b, 114c, 116a and 116b each comprise a flip-chip bump.

In an embodiment in which the substrate 102 comprises an interposer 104, a plurality of conductor portions 106a, 106b, 106c, . . . 106f and a plurality of insulator or dielectric portions 108a, 108b, 108c, . . . 108g are provided in the interposer 104. The conductor portions 106a, 106b, 106c, . . . 106f may be interspersed between the insulator or dielectric portions 108a, 108b, 108c, . . . 108g. In an embodiment, the conductor portions 106a, 106b, 106c, . . . 106f are patterned or positioned such that at least some of the conductor portions 106a, 106b, 106c, . . . 106f of the interposer 104 are directly connected to respective flip-chip bumps which support the chips in the FC device. For example, in the embodiment illustrated in FIG. 1, the bumps 114a, 114b and 114c for supporting the first chip 110 are directly connected to the conductor portions 106a, 106b and 106c of the interposer 104, respectively, while the bumps 116a and 116b for supporting the second chip 112 are directly connected to the conductor portions 106e and 106f of the interposer 104, respectively.

As shown in FIG. 1, the first chip 110 and the second chip 112 are spaced apart by a gap 124. In the embodiment illustrated in FIG. 1, the first chip 110 has a substantially rectangular cross section with a top horizontal surface 126 and lateral surfaces 128 and 130, while the second chip 112 also has a substantially rectangular cross section with a top horizontal surface 132 and lateral surfaces 134 and 136. It will be appreciated, however, that the chips 110 and 112 need not have rectangular cross sections in alternate embodiments. In an embodiment, a conductor shield 138 for ground shielding both the first and second chips 110 and 112 is provided. In an embodiment, the conductor shield 138 has a plurality of conductor surfaces, including a first conductor surface 140a that is directly connected to the conductor portion 106d of the substrate 102 or the interposer 104 beneath the gap 124 between the first chip 110 and the second chip 112.

In the embodiment shown in FIG. 1, the conductor shield 138 also has conductor surfaces 140b, 140c and 140d immediately surrounding the top horizontal surface 126 and the lateral surfaces 128 and 130 of the first chip 110, respectively. In a similar manner, the conductor shield 138 further includes conductor surfaces 140e, 140f and 140g immediately surrounding the top horizontal surface 132 and the lateral surfaces 134 and 136 of the second chip 112, respectively. In an embodiment, the conductor portion 106d of the substrate 102 or the interposer 104 may be grounded, thereby grounding the entire conductor shield 138 during electrical operations. In a further embodiment, the conductor shield 138 may be grounded by electrical connections with more than one grounded conductor portion of the substrate 102 or the interposer 104. For example, as illustrated in the embodiment shown in FIG. 1, the conductor shield 138 is also directly connected to the conductor portions 106a and 106f of the substrate 102 or the interposer 104 to the left and right sides of the first and second chips 110 and 112, in addition to the conductor portion 106d of the substrate 102 or the interposer 104 directly opposite the gap 124 between the first and second chips 110 and 112. In a further embodiment, a mold 142 is provided on outer surfaces opposite the surfaces 140a, 140b, 140c, . . . 140g of the conductor shield 138.

In an embodiment, the substrate 102 or the interposer 104 has a substantially flat top surface 118 over its conductor portions 106a, 106b, 106c, . . . 106f and its insulator or dielectric portions 108a, 108b, 108c, . . . 108g. In an embodiment, a first solder mask 144 is provided on the portion of the substrate 102 or the interposer 104 beneath the first chip 110, and a second solder mask 146 is provided on the portion of the substrate 102 or the interposer 104 beneath the second chip 112. In an embodiment in which the first plurality of bumps, such as bumps 114a, 114b and 114c as shown in FIG. 1, are spaced by gaps beneath the first chip 110, the first solder mask 144 may cover an area of the top surface 118 of the substrate 102 or the interposer 104 directly beneath the first chip 110 except for those areas occupied by the bumps. In addition, the first solder mask 144 may also cover one or more portions of the top surface 118 of the substrate 102 or the interposer 104 outside the immediate boundaries of the first chip 110. For example, in the embodiment illustrated in FIG. 1, the first solder mask 144 includes an end portion 144a that extends slightly beyond the lateral surface 130 of the first chip 110.

In an embodiment in which the second plurality of bumps, such as bumps 116a and 116b as shown in FIG. 1, are spaced by gaps below the second chip 112, the second solder mask 146 may cover an area of the top surface 118 of the substrate 102 or the interposer 104 directly beneath the second chip 112 except for those areas occupied by the bumps. Moreover, the second solder mask 146 may also cover one or more portions of the top surface 118 of the substrate 102 or the interposer 104 outside the immediate boundaries of the second chip 112. For example, in the embodiment illustrated in FIG. 1, the second solder mask 146 includes an end portion 146a that extends slightly beyond the lateral surface 134 of the second chip 112. In an embodiment, an opening 148 between the first solder mask 144 and the second solder mask 146 is provided which allows a direct electrical connection between the conductor surface 140a of the conductor shield 138 and the conductor portion 106d of the substrate 102 or the interposer 104. In an embodiment, the conductor portion 106d of the substrate 102 or the interposer 104 is grounded in operation, thereby grounding the entire conductor shield 138.

In an embodiment, a first capillary under-fill (CUF) 150 is provided to fill the space between the first chip 110 and the first solder mask 144, while a second CUF 152 is provided to fill the space between the second chip 112 and the second solder mask 146. In an embodiment, the first and second CUFs 150 and 152 may be provided as shielding isolation media for the first and second chips 110 and 112, respectively. In an embodiment, the first and second CUFs 150 and 152 may be provided to fill the spaces beneath the first and second chips 110 and 112, respectively, after the first and second solder masks 144 and 146, the first and second pluralities of bumps 114a, 114b, 114c, 116a and 116b, and the first and second chips 110 and 112 have been installed on the substrate 102 or the interposer 104. Embodiments of methods of making the device of FIG. 1 will be described in further detail below with respect to FIGS. 2-6.

Figure 2:
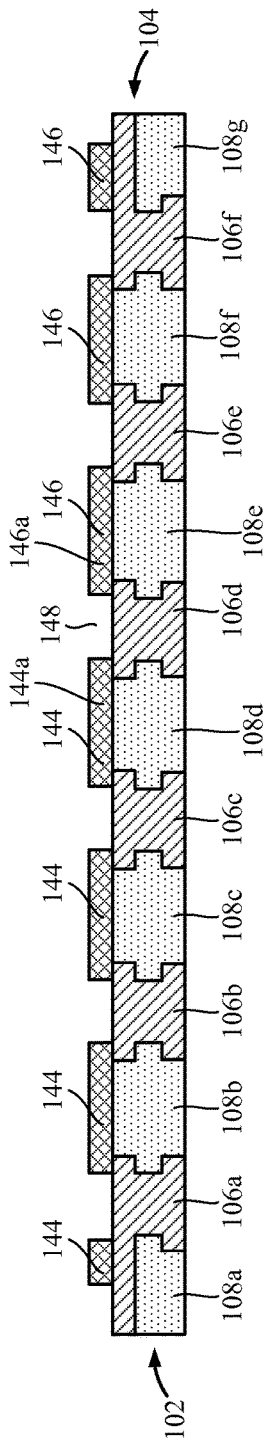
FIG. 2 is a cross-sectional view illustrating a first step in an embodiment of a method of making the FC device of FIG. 1.

FIG. 2 is a cross-sectional view illustrating a first step in an embodiment of a method of making the device of FIG. 1. In this embodiment, a substrate 102 or an interposer 104 comprising a plurality of conductor portions 106a, 106b, 106c, . . . 106f and a plurality of insulator or dielectric portions 108a, 108b, 108c, . . . 108g is provided. Such a substrate or interposer may be manufactured in a conventional manner known to persons skilled in the art. In an embodiment, the substrate 102 or the interposer 104 has a substantially flat top surface 118 over its conductor portions and its insulator or dielectric portions. In an embodiment, a first solder mask 144 and a second solder mask 146 are provided on the top surface 118 of the substrate 102 or the interposer 104.

Although in the sectional view of FIG. 2, the first and second solder masks 144 and 146 are shown as having multiple sections, the first solder mask 144 may be a single solder mask covering an area of the top surface 118 of the substrate 102 or the interposer 104 with openings for placements of flip-chip bumps such as bumps 114a, 114b and 114c to support the first chip 110. Likewise, the second solder mask 146 may be a single solder mask covering an area of the top surface 118 of the substrate 102 or the interposer 104 with openings for placements of flip-chip bumps such as bumps 116a and 116b to support the second chip 112. In an embodiment, respective end portions 144a and 146a of the first and second solder masks 144 and 146 are spaced by a gap or opening 148 which exposes the conductor portion 106d of the substrate 102 or the interposer 104, which will later provide a grounding connection to the conductor shield 138.

Figure 3:
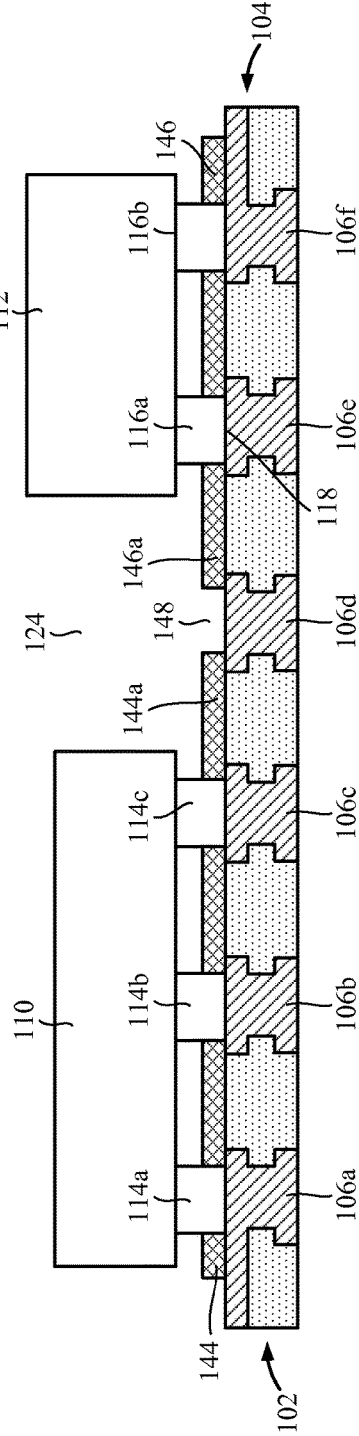
FIG. 3 is a cross-sectional view illustrating a second step in an embodiment of a method of making the FC device of FIG. 1.

FIG. 3 is a cross-sectional view illustrating a second step in an embodiment of a method of making the device of FIG. 1. In FIG. 3, a first plurality of bumps 114a, 114b and 114c and a second plurality of bumps 116a and 116b are provided on the top surface 118 of the substrate 102 or the interposer 104. In a further embodiment, the first plurality of bumps 114a, 114b and 114c are in direct contact with the conductor portions 106a, 106b and 106c of the substrate 102 or the interposer 104 through respective openings in the first solder mask 144, while the second plurality of bumps 116a and 116b are in direct contact with the conductor portions 106e and 106f of the substrate 102 or the interposer 104 through respective openings in the second solder mask 146. The first chip 110 is provided on the first plurality of bumps 114a, 114b and 114c, and the second chip 112 is provided on the second plurality of bumps 116a and 116b. The first chip 110 and the second chip 112 are spaced by a gap 124, which is directly above the gap or opening 148 between the end portions 144a and 146a of the first and second solder masks 144 and 146, respectively.

Figure 4:
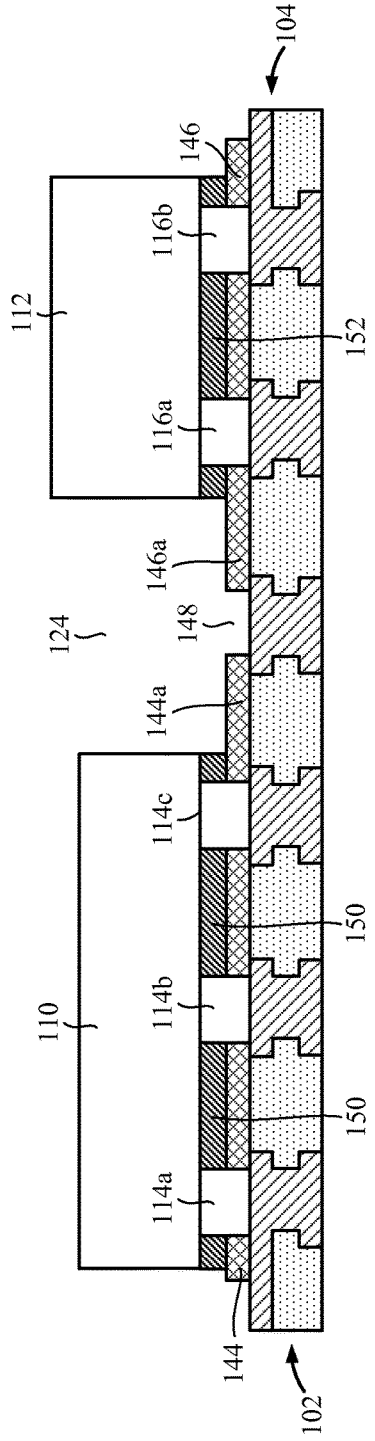
FIG. 4 is a cross-sectional view illustrating a third step in an embodiment of a method of making the FC device of FIG. 1.

FIG. 4 is a cross-sectional view illustrating a third step in an embodiment of a method of making the device of FIG. 1. In an embodiment, a first capillary under-fill (CUF) 150 and a second CUF 152 are provided on the first solder mask 144 and the second solder mask 146, respectively. In an embodiment, the first CUF 150 is provided to fill the space between the bottom of the first chip 110 and the top of the first solder mask 144 except for the spaces occupied by the first plurality of bumps 114a, 114b and 114c. In a similar manner, the second CUF 152 is provided to fill the space between the bottom of the second chip 112 and the top of the second solder mask 146 except for the spaces occupied by the second plurality of bumps 116a and 116b. In the embodiment shown in FIG. 4, the first and second CUFs 150 and 152 do not extend into the gap 124 between the first and second chips 110 and 112, and do not cover the gap or opening 148 between the end portions 144a and 146a of the first and second solder masks 144 and 146.

FIG. 5 is a cross-sectional view illustrating a fourth step in an embodiment of a method of making the device of FIG. 1. In FIG. 5, a conductor shield 138 is provided on the first and second chips 110 and 112 and over portions of the top surface 118 of the substrate 102 or the interposer 104 not covered by the solder masks or the CUFs. As illustrated in FIG. 5, the conductor surfaces of the conductor shield 138 include a conductor surface 140a that is in direct contact with the conductor portion 106d of the substrate 102 or the interposer 104.

The conductor surfaces of the conductor shield 138 also include conductor surfaces 140b, 140c and 140d in direct contact with the top horizontal surface 126 and the lateral surfaces 128 and 130 of the first chip 110, as well as conductor surfaces 140e, 140f and 140g in direct contact with the top horizontal surface 132 and the lateral surfaces 134 and 136 of the second chip 112. In the embodiment shown in FIG. 5, the conductor shield 138 is also in direct contact with the conductor portions 106a and 106f of the substrate 102 or the interposer 104 to the left and right sides of the first and second chips 110 and 112, respectively. In an embodiment, the conductor shield 138 may be provided as a conformal shield over the first and second chips 110 and 112 and other exposed portions of the device by sputtering or plating a metal, for example. Other metal processes may also be used in forming the conformal shield over the first and second chips 110 and 112 within the scope of the disclosure.

FIG. 6 is a cross-sectional view illustrating a fifth step in an embodiment of a method of making the device of FIG. 1. In an embodiment, a mold 142 may be disposed on the outer surfaces of the conductor shield 138 in a conventional molding process known to persons skilled in the art. As illustrated in FIG. 6, the conductor shield 138 has an outer surface 604a opposite the surface 140a that is in direct contact with the conductor portion 106d of the substrate 102 or the interposer 104, outer surfaces 604b, 604c and 604d directly opposite the surfaces 140b, 140c and 140d that immediately surround the first chip 110, respectively, and outer surfaces 604e, 604f and 604g directly opposite the surfaces 140e, 140f and 140g that immediately surround the second chip 112, respectively. As illustrated in FIG. 6, the mold 142 is not in direct contact with the surfaces of the substrate 102 or the interposer 104 or any of the first and second chips 110 and 112.

Figure 7:
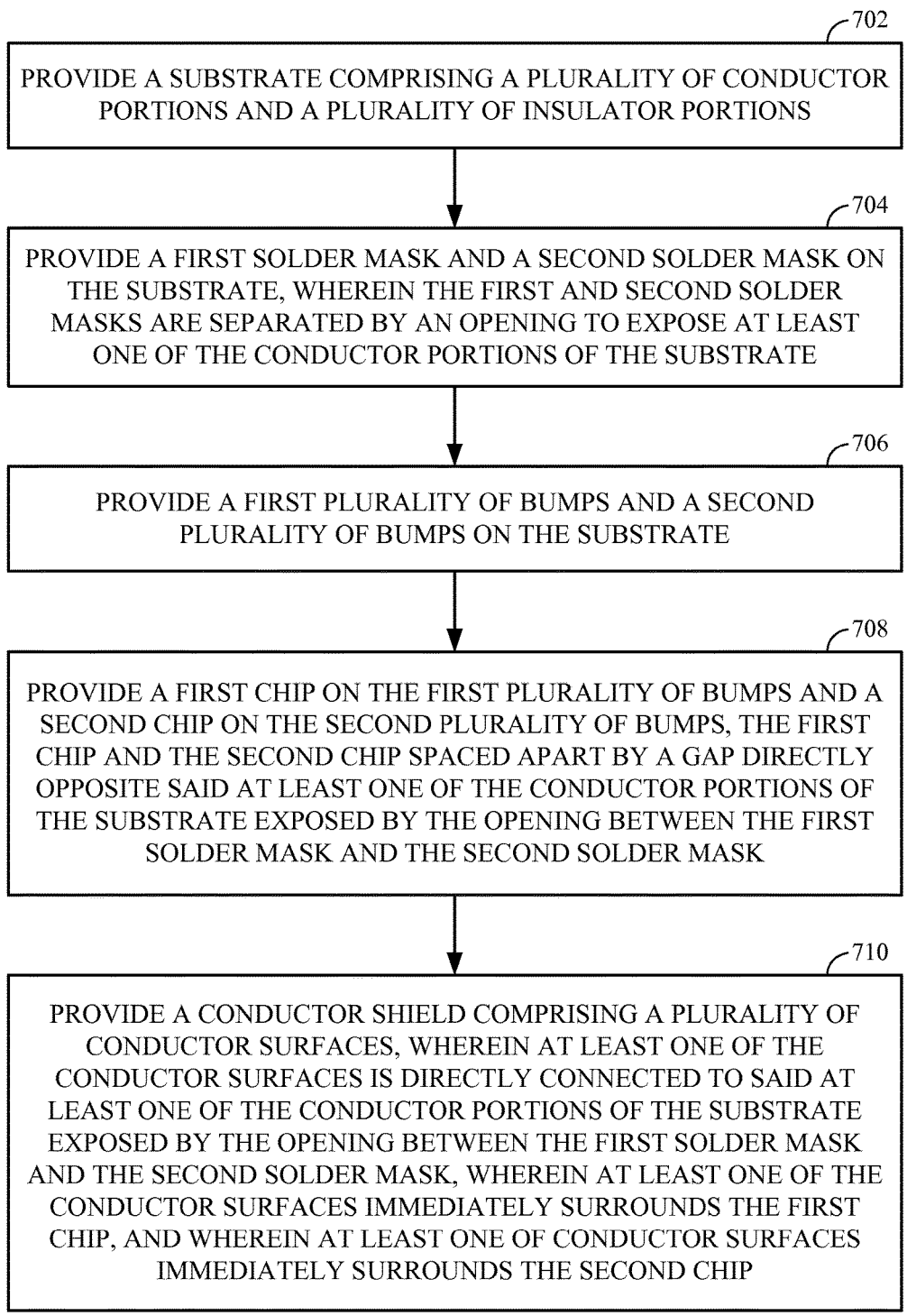
FIG. 7 is a flowchart illustrating process steps in an embodiment of a method of making an FC device.

FIG. 7 is a flowchart illustrating process steps in an embodiment of a method of making an FC device. In FIG. 7, a substrate comprising a plurality of conductor portions and a plurality of insulator portions is provided in block 702. A first solder mask and a second solder mask are provided on the substrate in block 704. In an embodiment, the first and second solder masks are separated by an opening to expose at least one of the conductor portions of the substrate. A first plurality of bumps and a second plurality of bumps are provided on the substrate in block 706. A first chip is provided on the first plurality of bumps and a second chip is provided on the second plurality of bumps in block 708. A conductor shield comprising a plurality of conductor surfaces is provided on block 710. In an embodiment, at least one of the conductor surfaces is directly connected to the conductor portion of the substrate exposed by the opening between the first solder mask and the second solder mask. In an embodiment, at least one of the conductor surfaces immediately surrounds the first chip, and at least one of conductor surfaces immediately surrounds the second chip.

In an embodiment, a first CUF is provided on the first solder mask and a second CUF is provided on the second solder mask to provide shielding isolation for the first and second chips, respectively. In embodiment, the conductor shield is provided by sputtering a metal on the first chip, the second chip, and the conductor portion of the substrate exposed by the opening between the first solder mask and the second solder mask. In an alternate embodiment, the conductor shield is provided by plating a metal on the first chip, the second chip, and the conductor portion of the substrate exposed by the opening between the first solder mask and the second solder mask. In a further embodiment, a molding is provided outside the conductor shield.

With a conductor shield that immediately surrounds each of the chips in an FC device or module, intra-module shielding between different chips within the same FC device or module is attained. Compact compartmentalized shielding is realized without the need for drilling into the mold between the chips. In an embodiment, CUFs with FC bumps may be utilized for electrical isolation of the chips. Furthermore, the conductor shield may be grounded by direct contacts with one or more grounded conductor portions of an interposer or substrate, thereby achieving reliable grounding of the conductor shield. With compact compartmentalized ground shielding, various digital, analog, mixed signal, or RF circuits on the same device or module may operate without undesirable electromagnetic or radio-signal (RF) interference between one another.

While the foregoing disclosure shows illustrative embodiments, it should be noted that various changes and modifications could be made herein without departing from the scope of the appended claims. The functions, steps or actions of the method claims in accordance with embodiments described herein need not be performed in any particular order unless expressly stated otherwise. Furthermore, although elements may be described or claimed in the singular, the plural is contemplated unless limitation to the singular is explicitly stated.

What is claimed is:

1. A device, comprising:
   a substrate comprising a top surface, a bottom surface opposite the top surface, a first edge, a second edge opposite the first edge, a plurality of conductor portions, and at least one insulator portion;
   a first plurality of bumps and a second plurality of bumps disposed on the top surface of the substrate;
   a first chip disposed on the first plurality of bumps;
   a second chip disposed on the second plurality of bumps, wherein the first chip and the second chip are spaced apart by a gap, and wherein a first conductor portion of the plurality of conductor portions is positioned directly opposite the gap between the first chip and the second chip and directly connected to a ground;
   a first solder mask directly under the first chip;
   a second solder mask directly under the second chip;
   a unitary conductor shield comprising a plurality of conductor surfaces, the plurality of conductor surfaces configured to form a continuous surface that covers exposed portions of the top surface of the substrate, wherein a first one of the plurality of conductor surfaces is directly connected to the first conductor portion of the plurality of conductor portions at the top surface of the substrate directly opposite the gap between the first chip and the second chip, wherein a second one of the plurality of conductor surfaces immediately surrounds and directly contacts the first chip, wherein a third one of the plurality of conductor surfaces immediately surrounds and directly contacts the second chip, wherein a fourth one of the plurality of conductor surfaces extends to the top surface of the substrate and directly contacts a second conductor portion of the plurality of conductor portions at the first edge of the substrate, and wherein a fifth one of the plurality of conductor surfaces extends to the top surface of the substrate and directly contacts a third conductor portion of the plurality of conductor portions at the second edge of the substrate opposite the first edge;

a first under-fill directly under the first chip between the first chip and the first solder mask and in direct contact with the first chip and the first solder mask;

a second under-fill directly under the second chip between the second chip and the second solder mask and in direct contact with the second chip and the second solder mask;

wherein the fourth one of the plurality of conductor surfaces is directly connected to the first solder mask and the first under-fill, and wherein the fifth one of the plurality of conductor surfaces is directly connected to the second solder mask and the second under-fill; and a mold material, the mold material configured to cover the unitary conductor shield without direct contact with the substrate, the first chip, or the second chip.

2. The device of claim 1, wherein the substrate comprises an interposer.

3. The device of claim 2, wherein the interposer comprises a plurality of dielectric portions and a plurality of conductor portions.

4. The device of claim 3, wherein the plurality of dielectric portions of the interposer include said at least one insulator portion of the substrate.

5. The device of claim 1, wherein at least some of the first and second pluralities of bumps are directly connected to at least some of the plurality of conductor portions of the substrate and the third one of the plurality of conductor surfaces directly contacts the second chip.

6. The device of claim 1, wherein the first solder mask extends towards the gap and the second solder mask extends towards the gap.

7. The device of claim 6, wherein the substrate comprises a plurality of insulator portions including said at least one insulator portion, and wherein the first and second solder masks are directly connected to at least some of the plurality of insulator portions of the substrate.

8. The device of claim 6, wherein the first under-fill is a capillary under-fill (CUF) disposed on the first solder mask; and the second under-fill is a CUF disposed on the second solder mask.

9. The device of claim 8, wherein the first chip is supported by the first plurality of bumps and the first CUF, and wherein the second chip is supported by the second plurality of bumps and the second CUF.

10. The device of claim 1, wherein the mold material is disposed on the unitary conductor shield.

11. The device of claim 1, wherein the first and second pluralities of bumps comprise flip-chip bumps.

12. A device, comprising:

an interposer comprising a plurality of conductor portions and a plurality of dielectric portions, the interposer having a substantially flat first surface over the plurality of conductor portions and the plurality of dielectric portions, a first edge perpendicular to the substantially flat first surface, a second edge opposite the first edge;

a first plurality of flip-chip bumps and a second plurality of flip-chip bumps disposed on the substantially flat first surface of the interposer;

a first chip disposed on the first plurality of flip-chip bumps;

a second chip disposed on the second plurality of flip-chip bumps, wherein the first chip and the second chip are spaced apart by a gap on the substantially flat first surface of the interposer, and wherein a first one of the plurality of conductor portions of the interposer is positioned directly opposite the gap between the first chip and the second chip and directly connected to a ground;

a first solder mask directly under the first chip;

a second solder mask directly under the second chip;

a unitary conductor shield comprising a plurality of conductor surfaces, the plurality of conductor surfaces configured to form a continuous surface that covers exposed portions of the substantially flat first surface of the interposer, wherein a first one of the plurality of conductor surfaces is directly connected to the first one of the plurality of conductor portions of the interposer at the substantially flat first surface of the interposer directly opposite the gap between the first chip and the second chip, wherein a second one of the plurality of conductor surfaces immediately surrounds and directly contacts the first chip, wherein a third one of the plurality of conductor surfaces immediately surrounds and directly contacts the second chip, wherein a fourth one of the plurality of conductor surfaces extends to the substantially flat first surface and directly contacts a second one of the plurality of conductor portions at the first edge of the interposer, and wherein a fifth one of the plurality of conductor surfaces extends to the substantially flat first surface and directly contacts a third one of the plurality of conductor portions at the second edge;

a first under-fill directly under the first chip between the first chip and the first solder mask and in direct contact with the first chip and the first solder mask;

a second under-fill directly under the second chip between the second chip and the second solder mask and in direct contact with the second chip and the second solder mask;

wherein the fourth one of the plurality of conductor surfaces is directly connected to the first solder mask and the first under-fill, and wherein the fifth one of the plurality of conductor surfaces is directly connected to the second solder mask and the second under-fill; and a mold material, the mold material configured to cover the unitary conductor shield without direct contact with the interposer, the first chip, or the second chip.

13. The device of claim 12, wherein at least some of the first and second pluralities of flip-chip bumps are directly connected to at least some of the plurality of conductor portions of the interposer.

14. The device of claim 12, wherein the first solder mask extends towards the gap and the second solder mask extends towards the gap.

15. The device of claim 14, wherein the first and second solder masks are directly connected to at least some of the plurality of dielectric portions of the interposer.

16. The device of claim 14, wherein the first under-fill is a capillary under-fill (CUF) disposed on the first solder mask; and the second under-fill is a CUF disposed on the second solder mask.

17. The device of claim 16, wherein the first chip is supported by the first plurality of flip-chip bumps and the first CUF, and wherein the second chip is supported by the second plurality of flip-chip bumps and the second CUF.

18. The device of claim 12, wherein the mold material is disposed on the unitary conductor shield.

19. A device, comprising:
a substrate comprising a plurality of conductor portions and a plurality of insulator portions, the substrate having a substantially flat first surface over the plurality of conductor portions and the plurality of insulator portions, a first edge perpendicular to the substantially flat first surface, a second edge opposite the first edge;
a first plurality of bumps and a second plurality of bumps disposed on the substantially flat first surface of the substrate;
a first chip disposed on the first plurality of bumps;
a second chip disposed on the second plurality of bumps, wherein the first chip and the second chip are spaced apart by a gap on the substantially flat first surface of the substrate, and wherein a first one of the plurality of conductor portions of the substrate is positioned directly opposite the gap between the first chip and the second chip and directly connected to a ground;
a first solder mask directly under the first chip;
a second solder mask directly under the second chip;
a first capillary under-fill (CUF) disposed between the first chip and the first solder mask and in direct contact with the first chip and the first solder mask;
a second CUF disposed between the second chip and the second solder mask and in direct contact with the second chip and the second solder mask;
means for ground shielding the first chip and the second chip wherein the means for ground shielding is a unitary body configured to form a continuous surface that covers exposed portions of the substantially flat first surface of the substrate and a first portion of the means for ground shielding directly contacts the first chip and directly contacts the second chip as well as the first one of the plurality of conductor portions at the substantially flat first surface of the substrate in the gap, wherein a second portion of the means for ground shielding extends to the substantially flat first surface and directly contacts a second one of the plurality of conductor portions at the first edge of the substrate, and wherein a third portion of the means for ground shielding extends to the substantially flat first surface and directly contacts a third one of the plurality of conductor portions at the second edge of the substrate opposite the first edge;
wherein the second portion of the means for ground shielding is directly connected to the first solder mask and the first CUF, and wherein the third portion of the means for ground shielding is directly connected to the second solder mask and the second CUF; and
a mold material, the mold material configured to cover the means for ground shielding without direct contact with the substrate, the first chip, or the second chip.

20. The device of claim 19, wherein the means for ground shielding the first chip and the second chip comprises a conductor shield comprising a plurality of conductor surfaces, wherein at least one of the plurality of conductor surfaces is directly connected to the first one of the plurality of conductor portions of the substrate directly opposite the gap between the first chip and the second chip, wherein at least one of the plurality of conductor surfaces immediately surrounds the first chip, and wherein at least one of the plurality of conductor surfaces immediately surrounds the second chip.

21. The device of claim 19, wherein the first solder mask extends towards the gap and the second solder mask extends towards the gap.

22. The device of claim 21, wherein the first and second solder masks are directly connected to at least some of the plurality of insulator portions of the substrate.

23. The device of claim 19, wherein the substrate comprises an interposer.

24. The device of claim 20, wherein the mold material is disposed on the conductor shield.

25. The device of claim 19, wherein the first and second pluralities of bumps comprise flip-chip bumps.

26. A method of making a device, comprising:
providing a substrate comprising a top surface, a bottom surface opposite the top surface, a first edge, a second edge opposite the first edge, a plurality of conductor portions and a plurality of insulator portions;
providing a first solder mask and a second solder mask on the substrate, wherein the first and second solder masks are separated by an opening to expose a first one of the plurality of conductor portions of the substrate;
providing a first plurality of bumps and a second plurality of bumps on the top surface of the substrate;
providing a first chip on the first plurality of bumps and a second chip on the second plurality of bumps, the first chip and the second chip spaced apart by a gap directly opposite the first one of the plurality of conductor portions of the substrate exposed by the opening between the first solder mask and the second solder mask and wherein the first one of the plurality of conductor portions of the substrate is directly connected to a ground;
providing a first under-fill directly under the first chip between the first chip and the first solder mask and in direct contact with the first chip and the first solder mask;
providing a second under-fill directly under the second chip between the second chip and the second solder mask and in direct contact with the second chip and the second solder mask;
providing a unitary conductor shield comprising a plurality of conductor surfaces, the plurality of conductor surfaces configured to form a continuous surface that covers exposed portions of the top surface of the substrate, wherein a first one of the plurality of conductor surfaces is directly connected to the first one of the plurality of conductor portions of the substrate exposed by the opening between the first solder mask and the second solder mask, wherein a second one of the plurality of conductor surfaces immediately surrounds and directly contacts the first chip, wherein a third one of the plurality of conductor surfaces immediately surrounds and directly contacts the second chip, wherein a fourth one of the plurality of conductor surfaces extends to the top surface of the substrate and directly contacts a second one of the plurality of conductor portions at the first edge of the substrate, and wherein a fifth one of the plurality of conductor surfaces extends to the top surface of the substrate and directly contacts a third one of the plurality of conductor portions at the second edge of the substrate opposite the first edge;
wherein the fourth one of the plurality of conductor surfaces is directly connected to the first solder mask and the first under-fill, and wherein the fifth one of the plurality of conductor surfaces is directly connected to the second solder mask and the second under-fill; and providing a mold material, the mold material configured to cover the unitary conductor shield without direct contact with the substrate, the first chip, or the second chip.

27. The method of claim 26, wherein the first under-fill is a capillary under-fill (CUF) on the first solder mask; and
wherein the second under-fill is a CUF on the second solder mask.

28. The method of claim 26, wherein the providing the unitary conductor shield comprises sputtering a metal on the first chip, on the second chip, and on the first one of the plurality of conductor portions of the substrate exposed by the opening between the first solder mask and the second solder mask.

29. The method of claim 26, wherein the providing the unitary conductor shield comprises plating a metal on the first chip, on the second chip, and on the first one of the plurality of conductor portions of the substrate exposed by the opening the first solder mask and the second solder mask.

30. The method of claim 26, wherein the mold material is disposed outside the unitary conductor shield.

* * * * *